United States Patent
Kim et al.

(10) Patent No.: US 8,130,891 B2
(45) Date of Patent: Mar. 6, 2012

(54) CLOCK-DATA RECOVERY ("CDR") CIRCUIT, APPARATUS AND METHOD FOR VARIABLE FREQUENCY DATA

(75) Inventors: Dennis Kim, San Francisco, CA (US); Jason Wei, Cupertino, CA (US); Yohan Frans, Palo Alto, CA (US); Todd Bystrom, Los Altos, CA (US); Nhat Nguyen, San Jose, CA (US); Kevin Donnelly, Los Altos, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 12/710,250

(22) Filed: Feb. 22, 2010

(65) Prior Publication Data

US 2010/0150290 A1      Jun. 17, 2010

Related U.S. Application Data

(63) Continuation of application No. 10/675,027, filed on Sep. 30, 2003, now Pat. No. 7,668,271.

(51) Int. Cl.
*H03D 3/24*         (2006.01)

(52) U.S. Cl. ............................................. 375/375

(58) Field of Classification Search .......... 375/354, 375/355, 359, 360, 371, 373, 374, 375, 376, 375/316, 322, 324, 326; 327/141, 100, 144, 327/146, 147, 148, 155, 156, 157
See application file for complete search history.

(56) References Cited

U.S. PATENT DOCUMENTS 3,773,975 A    11/1973    Koziol ............................. 178/66

(Continued)

FOREIGN PATENT DOCUMENTS

JP         2000035831 A2    2/2000

OTHER PUBLICATIONS

Brugel et al., "Variable Bandwidth DPLL Bit Synchronizer with Rapid Acquisition Implemented as a Finite State Machine" IEEE Transactions on Communications, vol. 42, No. 9, Sep. 1994, pp. 2751-2759.

*Primary Examiner* — David C. Payne
*Assistant Examiner* — Vineeta Panwalkar
(74) *Attorney, Agent, or Firm* — Vierra Magen Marcus & DeNiro LLP (57) ABSTRACT

A circuit, such as a CDR circuit, includes a sampler to receive a data signal having a variable data bit-rate responsive to a clock signal in an embodiment of the present invention. A clock circuit is coupled to the sampler and generates the clock signal responsive to a selectable update rate and a selectable phase adjust step-size. In a second embodiment of the present invention, the clock circuit includes a Stall logic that is coupled to first, second and third stages and is capable to hold the phase adjust signal responsive to the first and second stage output signals. In a third embodiment of the present invention, an indicator detects the variable data bit-rate and a counter provides the selectable phase adjust step-size for the adjust signal. In a fourth embodiment of the present invention, the clock circuit includes the Stall logic, the indicator and the counter. In a fifth embodiment of the present invention, the clock circuit includes an Averaging circuit to output a phase adjust signal responsive to the averaging of a first and second adjust signals for a predetermined period of time.

22 Claims, 11 Drawing Sheets

U.S. PATENT DOCUMENTS

| | | | | |
|---|---|---|---|---|
| 4,280,099 A | * | 7/1981 | Rattlingourd | 327/160 |
| 4,330,862 A | | 5/1982 | Smolik | 375/316 |
| 5,400,370 A | * | 3/1995 | Guo | 375/371 |
| 5,572,558 A | | 11/1996 | Beherns | 375/376 |
| 5,592,109 A | | 1/1997 | Notani et al. | 327/3 |
| 5,661,765 A | | 8/1997 | Ishizu | 375/376 |
| 5,742,798 A | | 4/1998 | Goldrian | 395/551 |
| 5,754,352 A | | 5/1998 | Beherns et al. | 360/51 |
| 5,838,749 A | | 11/1998 | Casper et al. | 375/376 |
| 5,987,238 A | | 11/1999 | Chen | 395/500.02 |
| 6,041,090 A | | 3/2000 | Chen | 375/376 |
| 6,055,286 A | * | 4/2000 | Wu et al. | 375/375 |
| 6,104,251 A | | 8/2000 | Ramey et al. | 331/14 |
| 6,285,228 B1 | | 9/2001 | Heyne et al. | 327/246 |
| 6,307,906 B1 | | 10/2001 | Tanji et al. | 375/376 |
| 6,366,628 B1 | | 4/2002 | Su et al. | 375/355 |
| 6,509,773 B2 | * | 1/2003 | Buchwald et al. | 327/248 |
| 6,642,747 B1 | | 11/2003 | Chiu | 327/40 |
| 6,753,712 B2 | * | 6/2004 | Saeki | 327/165 |
| 6,826,246 B1 | * | 11/2004 | Brown et al. | 375/376 |
| 6,963,629 B2 | | 11/2005 | Boerstler et al. | 375/376 |
| 7,386,080 B2 | * | 6/2008 | Paillet et al. | 375/355 |
| 7,409,031 B1 | * | 8/2008 | Lee et al. | 375/376 |
| 2002/0030522 A1 | | 3/2002 | Nakamura | 327/165 |
| 2003/0007585 A1 | * | 1/2003 | Dalton et al. | 375/376 |
| 2003/0128786 A1 | | 7/2003 | Schmatz et al. | 375/359 |
| 2004/0001567 A1 | * | 1/2004 | Wei | 375/371 |

* cited by examiner

CLOCK-DATA RECOVERY ("CDR") CIRCUIT, APPARATUS AND METHOD FOR VARIABLE FREQUENCY DATA

CROSS-REFERENCE TO RELATED APPLICATIONS

This application is a continuation of U.S. patent application Ser. No. 10/675,027 filed on Sep. 30, 2003, now pending.

FIELD OF THE INVENTION

The present invention relates to communication systems, and in particular, serial link systems.

BACKGROUND OF INVENTION

A serial data system consists of a transmit circuit for transmitting data bits on a serial link to a receive circuit. In a serial data system, the timing information to sample the incoming data signal is embedded in the data stream. To recover a time to sample or clock the incoming data signal, most receive circuits include a Clock-Data Recovery ("CDR") circuit to synchronize a sample clock with the incoming data. A CDR circuit actively looks for transitions in the incoming data and phase aligns a sample clock signal with respect to the incoming data transitions to provide maximum setup-hold timing margins.

A CDR circuit is typically responsible for tracking incoming data over a range of bit-rates. However, the bit-rate of the incoming data may be different than the frequency of the sample clock. Further, the bit-rate of the incoming data may vary over time with respect to the sample clock frequency. For example, the bit-rate of an incoming data signal may range between 1.50045 GHz and 1.49955 GHz at any particular time. In other words, a CDR circuit needs to track a data signal having a bit-rate of approximately 1.5 GHz±300 parts per million ("ppm").

Therefore, it is desirable to provide a circuit, such as a CDR circuit, apparatus and method that is capable of synchronizing a sample clock signal to incoming data even when such incoming data has a high variable data bit-rate.

DETAILED DESCRIPTION

In an embodiment of the present invention, a circuit, such as a CDR circuit, includes a sampler to receive, in response to a Dclk clock signal, a data signal having a variable data bit-rate. A Clock circuit is coupled to the sampler and generates the Dclk clock signal responsive to a phase adjust signal. A Phase Adjuster controller generates the Phase Adjust signal responsive to a Phase Adjust Step-Size signal. The value of the Phase Adjust Step-Size signal is dependent upon phase differences between the data signal and the Dclk clock signal.

In a another embodiment of the present invention, the Clock circuit includes Stall logic that is coupled to first, second and third stages of a CDR circuit and is capable of holding the Phase Adjust signal responsive to the first and second stage output signals.

In another embodiment of the present invention, an indicator detects the variable data bit-rate and a counter adjusts the phase adjust step-size for the Phase Adjust signal.

In another embodiment of the present invention, the Clock circuit includes Stall logic, the indicator and the counter.

In another embodiment of the present invention, the Clock circuit includes an Averaging circuit to output a Phase Adjust signal responsive to the average of a first and second Phase Adjust signals for a predetermined period of time.

Figure 1:
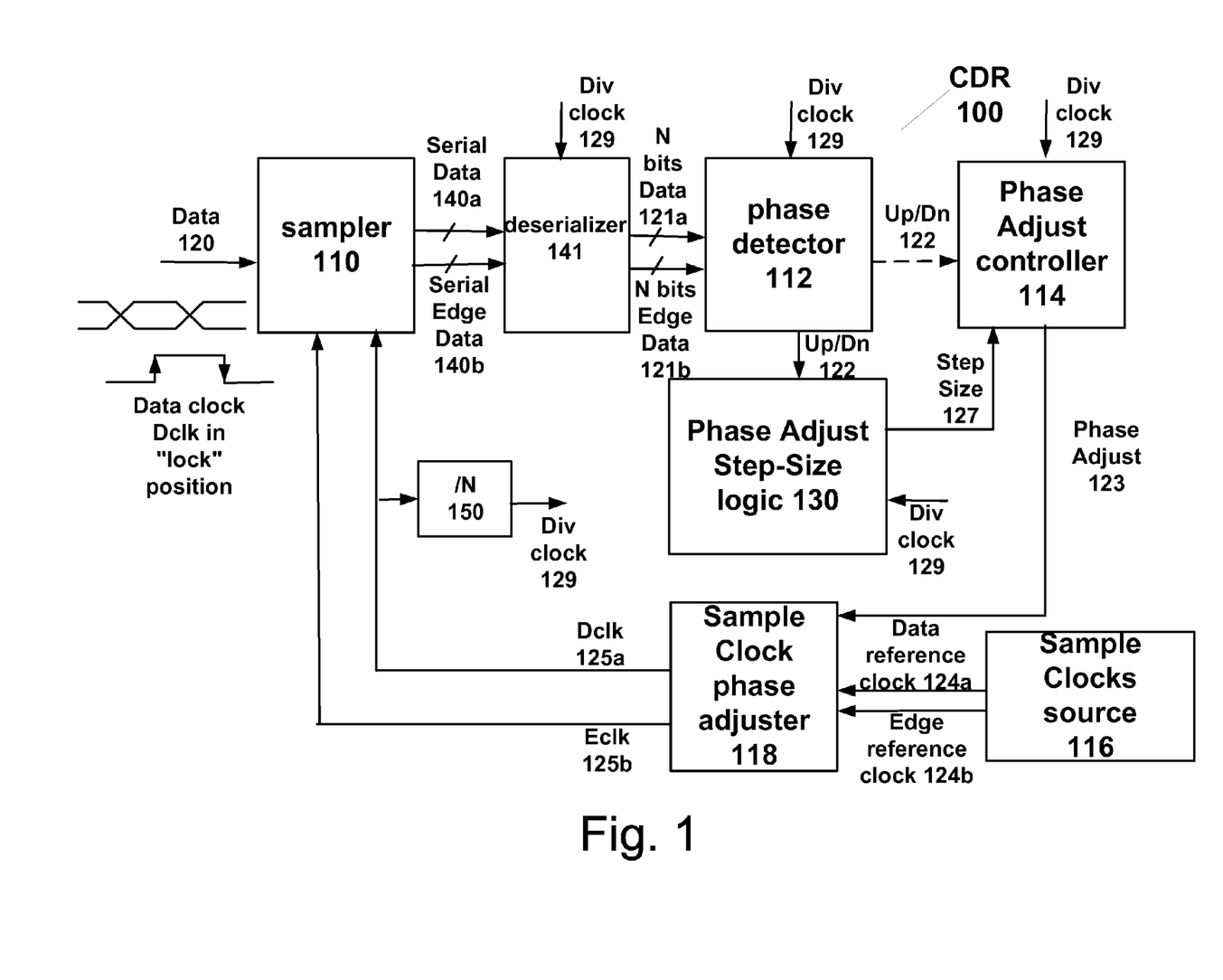
FIG. 1 is a block diagram illustrating a CDR circuit according to an embodiment of the present invention.

FIG. 1 illustrates a CDR circuit 100 having a Phase Adjust Step-Size logic 130 for determining a phase adjust step-size according to an embodiment of the present invention. CDR circuit 100 is able to track a Data signal 120 having a variable data bit-rate or variable frequency (also known as a spread spectrum). In an embodiment of the present invention, Data signal 120 has a bit-rate that has a fixed difference with respect to Dclk clock signal 125a. In another embodiment of the present invention, Data signal 120 has a data bit-rate that varies continuously in a range of data bit-rates with respect to Dclk clock signal 125a.

In an embodiment of the present invention, CDR circuit 100 is able to track a Data signal 120 varying from approximately 0 ppm to approximately 5000 ppm from a Dclk clock signal 125a. Embodiments of CDR circuit 100 and Phase Adjust Step-Size logic 130 are shown in FIGS. 5, 7, 8 and 10 and are described in detail below. Thus, as described herein, CDR circuit 100 is able to track an incoming Data signal 120 having a wide variation in date bit-rate or data phase drift (ppm) by adjusting a phase adjust step-size.

In an embodiment of the present invention, Phase Adjust Step-Size logic 130 based on ppm and the most recent Up/Dn signal 122 outputs a step size signal 127 indicating the magnitude and direction of a step size. In an embodiment of the present invention, Phase Adjust Step-Size logic 130 determines ppm of Data signal 120 with respect to Dclk 125a based on a plurality of Up/Dn signals received over a period of time.

For example, if Phase Adjust Step-Size logic 130 determines that ppm of Data signal 120 is much greater than zero and the latest Up/Dn signal is an Up signal, a Step-Size signal 127 indicating a zero change in magnitude and zero direction is output. If Phase Adjust Step-Size logic 130 determines that ppm of Data signal 120 is greater than zero and the latest Up/Dn signal is an Up signal, a Step-Size signal 127 indicating a 1 count magnitude and up direction is output. If Phase Adjust Step-Size logic 130 determines that ppm of Data signal 120 is zero and the latest Up/Dn signal is an Up signal, a Step-Size signal 127 indicating a 2 count magnitude and up direction is output. If Phase Adjust Step-Size logic 130 determines that ppm of Data signal 120 is less than zero and the latest Up/Dn signal is an Up signal, a Step-Size signal 127 indicating a 3 count magnitude and up direction is output. If Phase Adjust Step-Size logic 130 determines that ppm of Data signal 120 is much less than zero and the latest Up/Dn signal is an Up signal, a Step-Size signal 127 indicating a 4 count magnitude and up direction is output.

If Phase Adjust Step-Size logic 130 determines that ppm of Data signal 120 is much greater than zero and the latest Up/Dn signal is a Dn signal, a Step-Size signal 127 indicating a 4 count magnitude and down direction is output. If Phase Adjust Step-Size logic 130 determines that ppm of Data signal 120 is greater than zero and the latest Up/Dn signal is a Dn signal, a Step-Size signal 127 indicating a 3 count magnitude and down direction is output. If Phase Adjust Step-Size logic 130 determines that ppm of Data signal 120 is zero and the latest Up/Dn signal is an Dn signal, a Step-Size signal 127 indicating a 2 count magnitude and down direction is output. If Phase Adjust Step-Size logic 130 determines that ppm of Data signal 120 is less than zero and the latest Up/Dn signal is an Dn signal, a Step-Size signal 127 indicating a 1 count magnitude and down direction is output. If Phase Adjust Step-Size logic 130 determines that ppm of Data signal 120 is much less than zero and the latest Up/Dn signal is an down signal, a Step-Size signal 127 indicating a 0 count magnitude and down direction is output.

If Phase Adjust Step-Size logic 130 determines the latest Up/Dn signal is a no transition signal or no Up or Dn signal is received, a Step-Size signal 127 indicating a zero magnitude change and no change in direction regardless of the ppm of Data signal 120.

In an embodiment of the present invention, a 4 count change in magnitude equals 4 times the 1 count magnitude. Likewise, for the 3 and 2 count magnitude changes.

CDR circuit 100 includes a sampler 110 that receives a Data signal 120 in response to a Dclk clock signal 125a provided by Sample Clock phase adjuster 118. A deserializer 141 receives serial data 140a and serial edge data 140b from sampler 110 and outputs in a parallel format N bits of data 121a and N bits of Edge data 121b every update cycle to phase detector 112. The update rate is the rate or frequency at which the (phase adjust) Step-Size signal 127 is recalculated or regenerated. An update cycle is the period of time between recalculating or regenerating the outputs of the components (e.g., deserializer 141, phase detector 112, Phase Adjust controller 114, and Phase Adjust Step-Size logic 130) clocked by Div Clock 129. Phase detector 112 then uses N bits of data 121a and the last bit from the previous N-bit update cycle (for a total of N+1 bits of data) along with N bits of edge data 121b to produce outputs up, down, or no transition ("Up/Dn") signal 122 to a Phase Adjust Step-Size logic 130. In an alternate embodiment of the present invention, Up/Dn signal 122 is provided as a phase movement signal to Phase Adjuster controller 114.

In an embodiment of the present invention, sampler 110 includes multiple samplers or receive circuits.

In an embodiment of the present invention, a phase detector 112 includes a majority detector that takes the phase information from each of the N+1 bits of data and N bits of edge data. The N+1 bits of data determine if there is transition between each of the data bits and uses the corresponding N bits of edge data to determine if Dclk 125a and Eclk 125b are early or late relative to Data 120. The majority detector votes on each of transitions in the N+1 bits of data, using the N bits of edge data, to provide a single Up, Dn, or no transition signal. Phase adjuster 114 then generates a Phase Adjust signal 123, responsive to Up/Dn signal 122, to Sample Clock phase adjuster 118 in order to align a Dclk clock signal 125a with respect to a Data signal 120. Sample Clock phase adjuster 118 outputs a Dclk clock signal 125a to sampler 110 responsive to a Phase Adjust signal 123 and a Data reference clock signal 124a from Sample Clocks source 116. Sample Clock phase adjuster 118 outputs a Eclk clock signal 125b to sampler 110 responsive to a Phase Adjust signal 123 and a Edge reference clock signal 124b from Sample Clocks source 116.

In an embodiment of the present invention, Sample Clocks source 116 includes a phase lock loop circuit. In an embodiment of the present invention, Sample Clocks source 116 generates two clock signals: Data reference clock signal 124a and Edge reference clock signal 124b. In an embodiment of the present invention, both edges of Dclk 125a are used to time sampling of data values in Data signal 120. In an alternate embodiment of the present invention, four clock signals are output in a double data rate ("DDR") mode of operation. Complementary clock signals that are 180 degrees out of phase from Data reference clock 124a and Edge reference clock 124b are also respectively output from Sample Clocks source 116 in a DDR mode of operation. Similarly, corresponding clock signals are output from Sample Clock phase adjuster 118 in a DDR mode of operation. Dclk clock signal 125a and Eclk clock signal 125b are output from Sample Clock phase adjuster 118 to sampler 110. The Dclk clock signal 125a also inputs into Divide-by-N circuit 150. In an embodiment of the present invention, N equals the number of bits output in parallel format from deserializer 110a. In a double data rate operation embodiment, Dclk clock signal 125a is divided by N/2 by divide-by-N circuit 150 and input to sampler 110. For example, if 10 bits of data are output from deserializer 141, Divide-by-N circuit 150 would divide Dclk 125a by 10. If 10 bits of data were output from deserializer 141 in a DDR mode of operation, Divide-by-N circuit 150 would divide Dclk 125a by 5.

In an embodiment of the present invention, Divide-by-N circuit 150 generates a Div Clock signal 129 for timing circuit components of CDR 100. In particular, Div Clock signal 129 is input to deserializer 141, phase detector 112, Phase Adjuster controller 114 and Phase Adjust Step-Size logic 130.

Phase Adjust Step-Size logic 130 outputs a Step-Size signal 127 to Phase Adjust controller 114 in order to select the direction and/or the magnitude of the (phase adjust) step-size Phase Adjust signal 123 in an embodiment of the present invention. Step-size of Phase Adjust signal 123 is set as a number of bits of resolution as described below in various embodiments of the present invention. Phase Adjust Step-Size logic 130 may receive and/or output additional signals, some of which are described herein in various embodiments of the present invention. In an alternative embodiment of the present invention, Phase Adjust Step-Size logic 130 may be located within other circuit components of CDR circuit 100, such as Phase Adjust controller 114.

A step-size or resolution, including the direction of a Phase Adjust signal 123 is selected in response to Step-Size signal 127. Phase Adjuster controller 114 generates a Phase Adjust signal 123 in response to Step-Size signal 127. Phase Adjust signal 123 represents both the magnitude and the direction of the step-size change. In an embodiment of the present invention, the Step-Size signal 127 represents the phase adjustment needed (which may be expressed as an amount of time or a portion of a clock cycle) to shift clock signals 124a-b to produce Dclk clock signal 125a and Eclk clock signal 125b. In an embodiment of the invention, the Phase Adjust signal 123 is expressed as a number of bits that represents a time or clock cycle portion.

An update rate is the rate at which CDR circuit 100 updates the Phase Adjust signal 123. An update rate is determined by the number of bits N output in parallel format by deserializer 141. In an embodiment of the present invention, the number of bits output by deserializer 141 is N and is selected during initialization or manufacture of CDR 100. In an alternate embodiment of the present invention, the number of bits N output from deserializer 141 is adjusted during operation of CDR 100. In this embodiment of the present invention, divide-by-N circuit 150 is adjusted to output Div Clock signal 129 correspond to the adjusted N parallel bits output from deserializer 141. For example, for an N-bit update rate, N bits of data 121a is transferred from deserializer 141 on N lines to phase detector 112 in order to determine a Phase Adjust signal 123 from Phase Adjuster controller 114 to Sample Clocks source 118.

CDR circuit 100 may also be described in terms of a number of pipeline stages. A pipeline stage is defined as a circuit component that processes data within a single update cycle. In an embodiment of the present invention, CDR circuit 100 includes 6 pipeline stages. Because the phase detector 112 illustrated in FIG. 1 may, in an embodiment of the invention, require 2 update cycles to generate Up/Dn 122, phase detector 112 may be described as a circuit component having two pipeline stages.

The maximum phase variation (expressed in terms of the parts per million (ppm), and which is sometimes referred to as maximum data phase drift or maximum tracking rate) that CDR circuit 100 is able to tolerate is equal to the ratio of the step-size to the update rate multiplied by the bit-time of data signal 120, as seen below in Equation ("Equ.") 1:

$$\text{ppm} = \text{step-size/update rate} * \text{bit-time} \qquad \text{Equ. 1}$$

Figure 2:
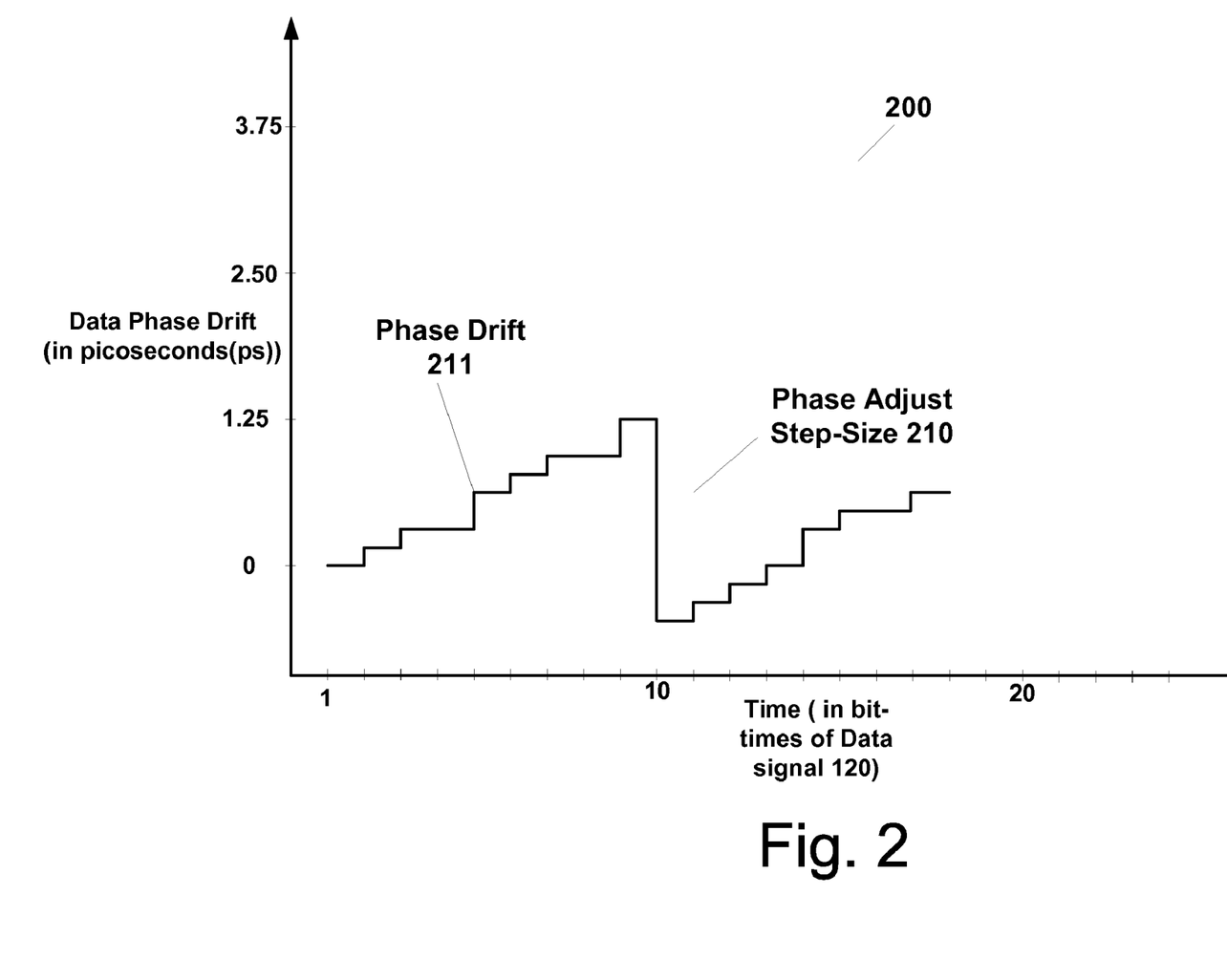
FIG. 2 is a diagram illustrating phase drift between a data signal and a clock signal recovered from the data signal using a CDR circuit, according to an embodiment of the present invention.

FIG. 2 shows a discrete data phase drift/adjust curve 200 illustrating Equ. 1. For example, if deserializer 141 outputs 10 bits per update cycle and if phase detector 112 observes at least one transition within that update cycle, phase adjuster controller 114 will generate a phase adjust signal 123 which will shift Data reference clock signal 124a by the phase adjust step-size 210 after data phase drift 211 has occurred. A phase adjust step-size 210 will have to be greater than the amount of phase drift 211 that occurs within those 10 bit-times or:

$$\text{step-size} \geq \text{update rate} * \text{ppm} * \text{bit-time} \qquad \text{Equ. 2}$$

For example,
if Data signal 120 equals 4 Gbps with 500 ppm of drift;
Dclk clock signal 125a equaling 2 GHz (if DDR); and
a bit-time of Data signal 120 equals 250 ps (10 bit-times equal 2.5 ns);
amount of data drift ppm in 10 bit-times equal 1.25 ps.
In this example, a CDR circuit 100 may observe as much as 1.25 ps of phase drift in 10 bit-times. In order to overcome phase drift 211, a phase adjust step-size 210 has to be larger than 1.25 ps.

Thus, in order to increase the maximum tracking rate of CDR circuit 100 having a fixed bit-time of Data signal 120, a step-size and/or an update rate must be adjusted or selected for a data signal having a variable data bit-rate. Maximum tracking rate is the largest ppm variation in a Data signal 120 CDR circuit 100 can tolerate and still acquire or lock to.

Assuming 8-bits for the step-size for Phase Adjust signal 123, the step-size would be 1.95 ps for this example (500 ps (2× bit-time)/$2^8$=1.95). A 10-bit update rate and 8-bit step-size provides a maximum tracking rate for CDR circuit 100 of 780 ppm:

$$\text{ppm} = \text{step-size/update rate} * \text{bit-time} \qquad \text{Equ. 3}$$
$$= 1.95 \text{ ps}/10 * 250 \text{ ps}$$
$$= 780 \text{ ppm}$$

If Data signal 120 has a greater data bit-rate than 780 ppm, CDR circuit 100 will not be able to "catch up" and lock to Data signal 120 because the data phase drift will be greater than the phase adjust step-size or maximum tracking rate of CDR circuit 100. When a step-size of Phase Adjust signal 123 is increased to a 6-bit resolution (500 ps/$2^6$=7.81 ps) and an update rate is decreased to 5-bits, CDR circuit 100 has an increased maximum tracking rate of 6248 ppm, which is 8 times the maximum tracking rate of a CDR circuit 100 using 10-bit update rate and 8-bit step-size $$\text{ppm}_{\text{5-bit update/6-bit step-size}} = 7.81 \text{ ps}/5*250 \text{ ps} = 6248 \text{ ppm} \qquad \text{Equ. 4}$$

Figure 3:
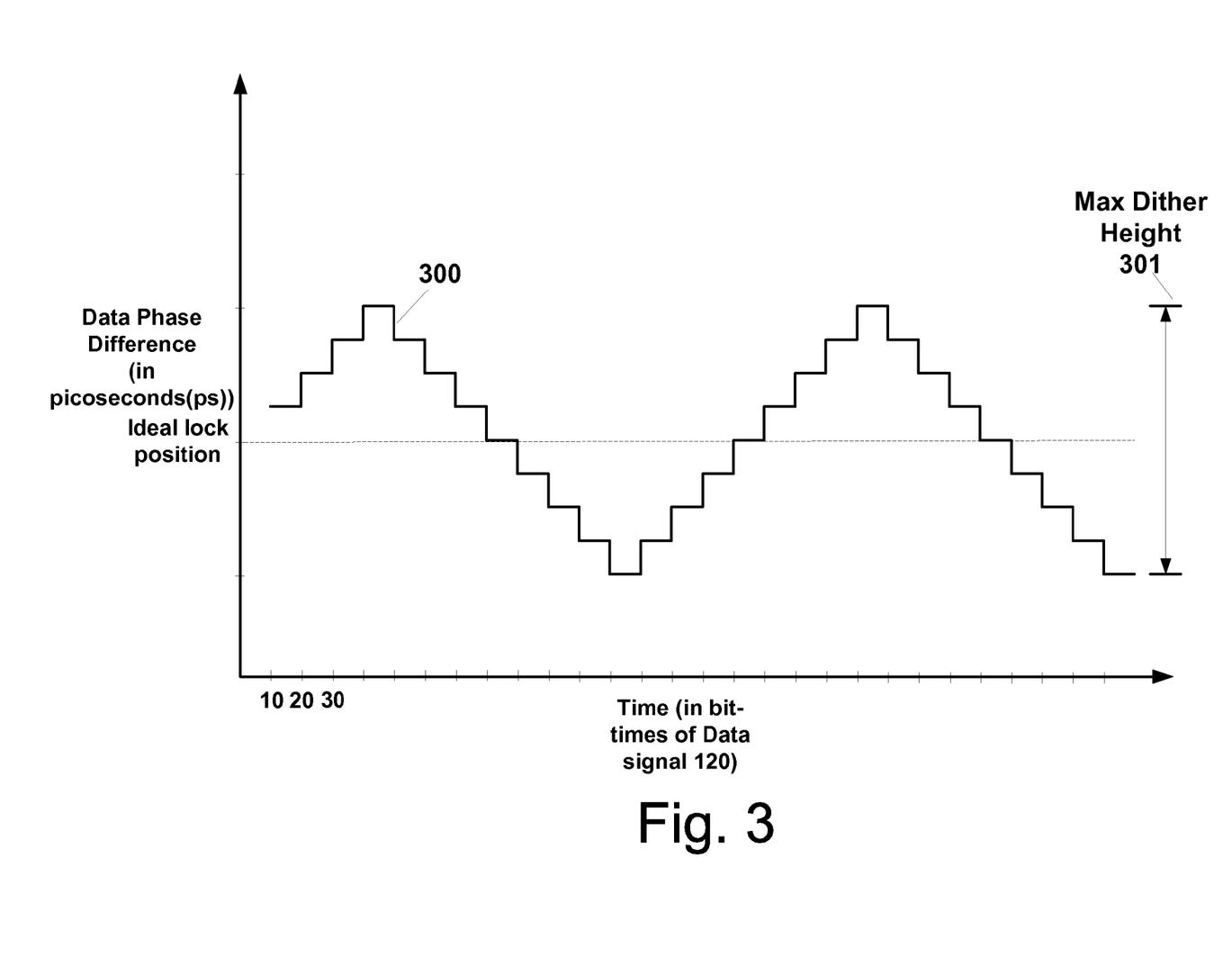
FIG. 3 is a diagram illustrating the dither height of a CDR circuit, according to an embodiment of the present invention.

However by increasing a phase adjust step-size, the dither associated with CDR circuit 100 is likewise increased. Dither is the amount of phase offset from a Dclk clock signal 125a to Data signal 120 from the ideal lock position when CDR circuit 100 is tracking Data signal 120. FIG. 3 illustrates a data phase drift/adjust curve 300 representing the amount of dither of CDR circuit 100 as a function of bit-time of Data signal 120 when there is no ppm difference between Data signal 120 and Dclk clock signal 125a. Maximum dither height 301 illustrates the maximum phase difference between Data signal 120 and Dclk clock signal 125a when CDR 100 is operating around the ideal lock position. The dither is a function of step-size and circuit latency.

In an embodiment of the invention, the update rate may be decreased if the CDR circuit 100 is capable of operating a higher frequency by increasing the frequency of Div clock signal 129. For example, in order to decrease the update rate from 10 bits of data to 5 bits of data, each pipeline stage of CDR circuit 100 would need to operate twice as fast.

Maximum ("Max") dither height, when Data signal 120 does not include a variable data bit-rate (ppm), may be expressed as a function of the number of pipeline stages in CDR circuit 100 and the step-size as seen in Equ. 5:

$$\text{Max dither height} = \pm(\text{pipeline stages} \times \text{step-size}) \qquad \text{Equ. 5}$$

For example, a CDR circuit 100 having 6 pipeline stages and a 6-bit step-size has a relatively large maximum dither height, which may be expressed as a percentage of the bit-time of Data signal 120:

$$\text{Max dither height} = \pm(6 \times (2 \times \text{bit-time})/2^6) \qquad \text{Equ. 6}$$
$$= \pm(0.1875 \times \text{bit-time})$$

In comparison, a CDR circuit 100 having 6 stages and an 8-bit step-size has a maximum dither height which is smaller, by a factor of 4, than the maximum dither height of an analogous CDR circuit 100 using a 6 bit step-size:

$$\text{Max dither} = \pm(0.047 \times \text{bit-time}) \qquad \text{Equ. 7}$$

Figure 5:
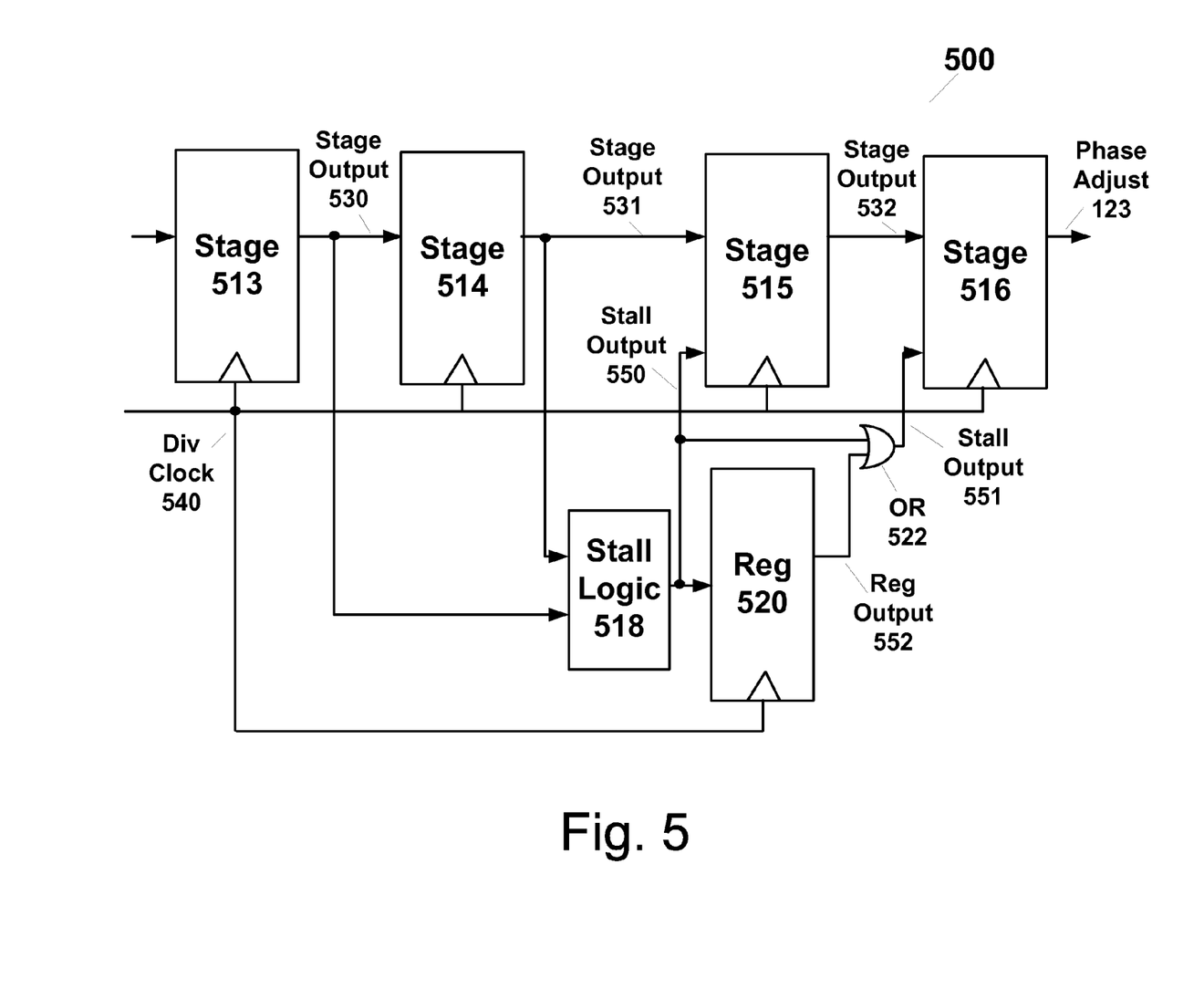
FIG. 5 is a block diagram illustrating a Stall circuit according to an embodiment of the present invention.

FIG. 5 illustrates Stall logic 500 along with components of CDR 100 seen in FIG. 1 represented as pipeline stages 513-

Figure 4:
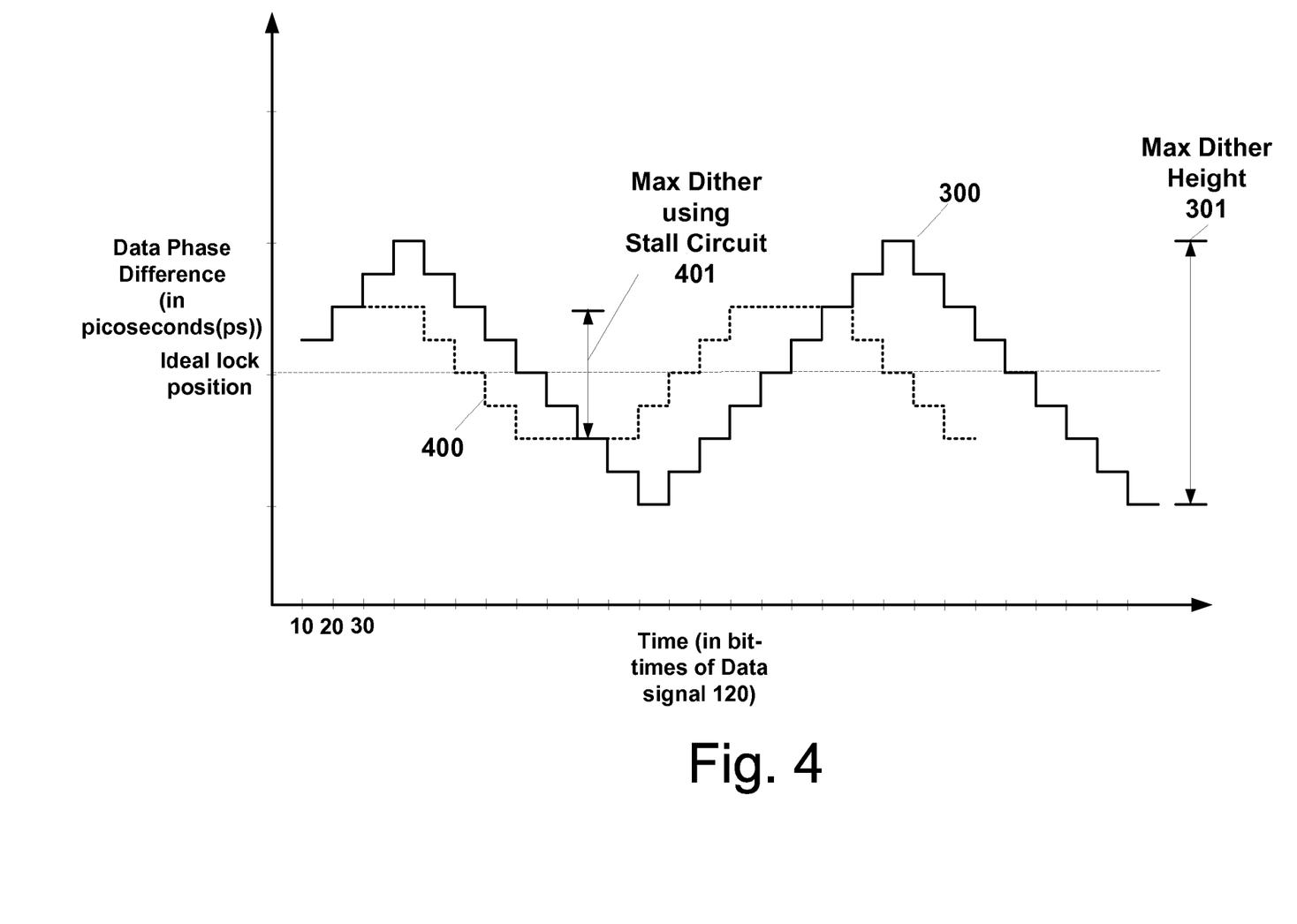
FIG. 4 is a diagram illustrating a reduced dither height when using a CDR circuit having a Stall circuit according to an embodiment of the present invention.

16. For example, pipeline stages 513 and 514 represent phase detector 112 illustrated in FIG. 1. In an embodiment of the present invention, Stall circuit 500 shown in FIG. 5 is used to reduce maximum dither height 301 of phase drift curve 300 as seen in FIGS. 3 and 4. Selectively stalling or bypassing a few pipeline stages in CDR circuit 100 reduces maximum dither height 301. Stall circuit 500 looks ahead at up/down signals from a phase detector 112 and holds or latches an Up/Dn signal 122 if Stall logic 518 determines that an up to down or down to up transition is requested by consecutive stages by comparing two previous adjacent stage outputs in CDR circuit 100.

FIG. 5 illustrates a Stall circuit 500 along with 4 of 6 pipeline stages in CDR circuit 100 in an embodiment of the present invention. In an embodiment of the present invention, Stall circuit 500 includes Stall logic 518, register ("Reg") 520 and OR gate 522 that are coupled to the various pipeline stages. Stage 513 outputs a Stage Output signal 530 to stage 514 that likewise outputs a Stage Output signal 531. Stage 515 outputs a Stage Output signal 532 responsive to an inputted Stage Output signal 531. Stage 516 outputs a Phase Adjust signal 123 responsive to an inputted Stage Output signal 532. Stages 513-516 and Reg 520 are timed by a Div Clock signal 540. Stage Output signals 530 and 531 are input to Stall logic 518 which outputs a Stall Output signal 550 to stage 515, Register 520 and OR gate 522. Register 520 outputs a Register Output signal 552 to OR gate 522. OR gate 522 outputs Stall Output signal 551 to stage 516 responsive to Stall Output signal 550 and Register Output signal 552. Accordingly, Stall logic 518 outputs Stall Output signal 550 to stall or hold Stage Output signal 532 and Phase Adjust signal 123 of stages 515 and 516, respectively, for an update cycle, by looking ahead at Stage Output signals 530 and 531. Likewise, Stall Output signal 551 stalls or holds Phase Adjust signal 123 an additional update cycle.

For example, after comparing up/down signals in Stage Output signals 530 and 531, respectively, the last two stages of CDR circuit 100 may be stalled (stages 515 and 516). In other words, if Stall logic 518 detects an Up signal from stage 513, such as a phase detector 112, and stages 514, 515 and 516 are outputting Down signals, by comparing outputs from stages 513 and 514 for a change in the direction of tracking (an up to down or a down to up transition), stages 515 and 516 can be stalled to reduce the maximum dither height 301.

FIG. 4 illustrates reducing maximum dither height when using Stall circuit 500. Data phase difference curve 300 illustrates a maximum dither height 301 when not using Stall circuit 500. In comparison, data phase difference curve 400 illustrates a significantly reduced maximum dither height 301 when using Stall circuit 500. Thus, a CDR circuit 100 with a 6-bit step-size and having 6 stages in which 2 stages may be stalled is equivalent to a CDR circuit having 4 stages with a reduced maximum dither height as seen in Equ. 8:

$$\text{Max dither height} = \pm(4 \times (2 \times \text{bit-time})/2^6) \qquad \text{Equ. 8}$$
$$= \pm(0.125 \times \text{bit-time})$$

Figure 6:
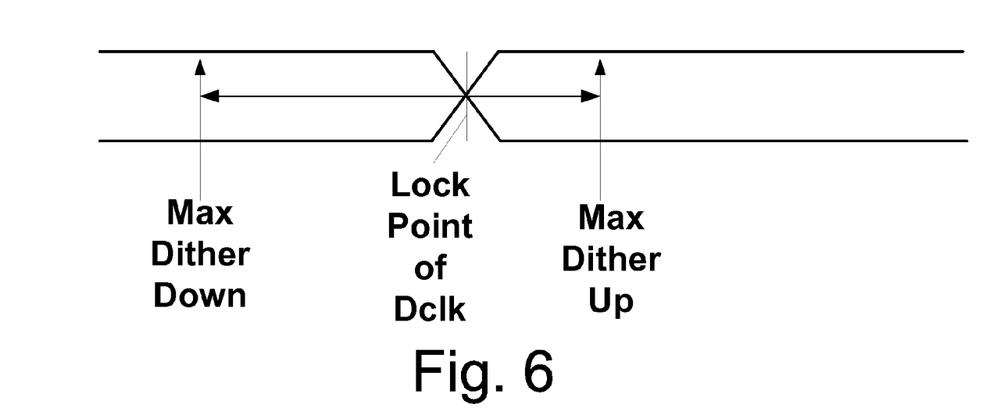
FIG. 6 illustrates maximum dither up and maximum dither down according to an embodiment of the present invention.

Decreasing the maximum dither height, as described above, does not take into account a variable data bit-rate (ppm) in Data signal 120. When a variable data bit-rate is present in Data signal 120, maximum dither height decreases in the direction a Dclk clock signal 124a tracks to data phase drift (i.e. "catch-up") per update rate, but increases (adds to step-size) the dither away from the direction of Dclk clock signal 124a versus data phase drift. FIG. 6 and Equations 9 and 10 illustrate this relationship:

$$\text{max dither up} = \text{\# pipeline stages} \times (\text{step-size} - \text{data phase drift}) \qquad \text{Equ. 9}$$

$$\text{max dither down} = \text{\# pipeline stages} \times (\text{step-size} + \text{draft phase drift}) \qquad \text{Equ. 10}$$

For example, a CDR circuit 100 having a 5-bit update rate, 6 pipeline stages and a 6-bit step-size has the following maximum dither up and down values:

$$\text{max dither up} = 6 \times ((2 \times \text{bit-time})/2^6) - \qquad \text{Equ. 11}$$
$$5 \times \text{ppm} \times \text{bit-time})$$
$$= 6 \times (1/2^5 - 5 \times \text{ppm}) \times \text{bit-time}$$

$$\text{max dither down} = 6 \times ((2 \times \text{bit-time})/2^6) - \qquad \text{Equ. 12}$$
$$5 \times \text{ppm} \times \text{bit-time})$$
$$= 6 \times (1/2^5 + 5 \times \text{ppm}) \times \text{bit-time}$$

with
ppm=5000:
max dither up=0.0375× bit-time
max dither down=0.3375× bit-time

Thus, maximum dither down is an order of magnitude larger than maximum dither up.

Even if Stall circuit 500 were used, a CDR circuit 100 would not be able to track Data signal 120 having certain variable data bit-rates without additional correction or step-size correction based on the data bit-rate of Data signal 120. As can be seen by Equation 13, maximum dither down, using an effective 4 stage CDR circuit, is still a relatively large percentage of bit-time:

$$\text{max dither down} = 4 \times ((2 \times \text{bit-time})/2^6) + \qquad \text{Equ. 13}$$
$$6(5 \times \text{ppm} \times \text{bit-time})$$
$$= 0.275 \times \text{bit-time}$$

Figure 7:
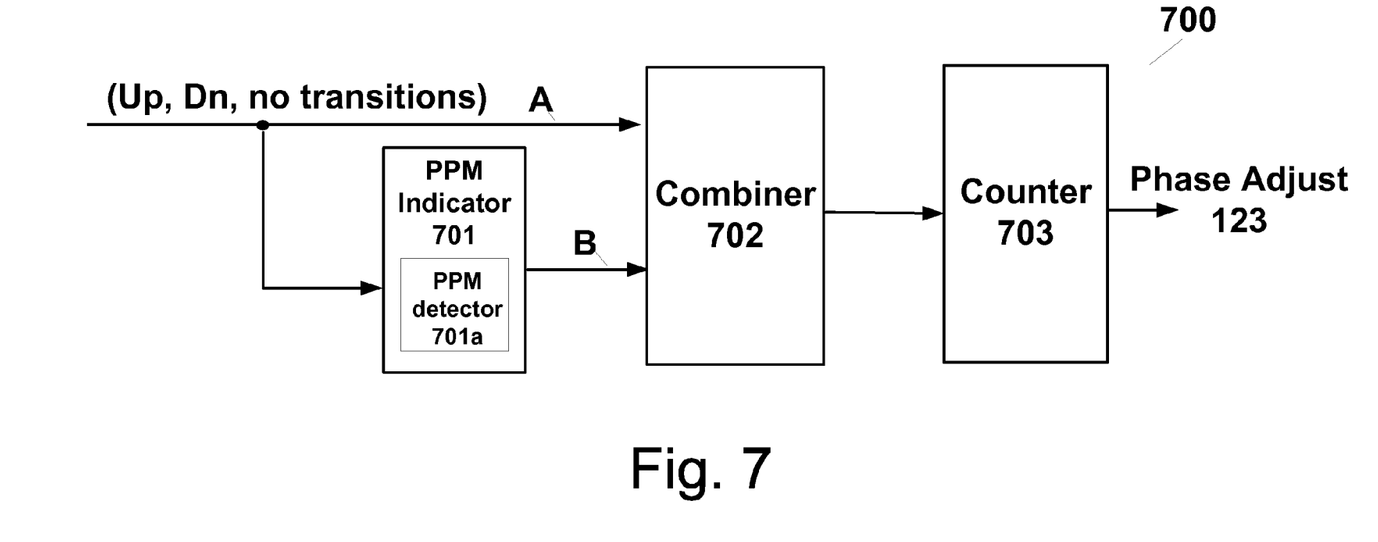
FIG. 7 illustrates a PPM indicator and counter/adder according to an embodiment of the present invention.

In an embodiment of the present invention, the PPM indicator 701, as illustrated in FIG. 7, may be included in Phase Adjust Step-Size logic 130, and Step Size combiner 702 and counter 703 may be included in Phase Adjuster controller 114 and the two may be used to adjust the step-size of Phase adjust signal 123 responsive to phase error and an amount of data phase drift. Circuit 700 uses both phase error and data phase drift to provide a phase adjust step-size of Phase Adjust signal 123. Circuit 700 includes a data phase drift or ("Parts Per Million") PPM indicator 701, Step Size combiner 702 and counter 703. PPM indicator 701 receives a signal A that includes phase error, in the form of Up/Dn signal 122 or no transitions. Step Size combiner 702 likewise receives signal A and sets a predetermined phase adjust step-size$_{up/dn}$ responsive to the Up/Dn signal 122.

In an embodiment of the present invention, Up/Dn signal 122 is input to PPM indicator 701 which detects a data drift of Data signal 120 and outputs a signal B that represent a variable phase adjust step-size$_{ppm}$ associated with a measured data phase drift of Data signal 120. Variable phase adjust step-size$_{ppm}$ represents a variable step-size based on the ppm drift between Data signal 120 and Dclk 124a. In an embodiment of the present invention, signal A corresponds to Up/Dn signal 122 (dashed line) or phase movement signal from phase detector 112 to Phase Adjust controller 114; and signal B corresponds to Step-Size signal 127 shown in FIG. 1

In an embodiment of the present invention, counter 703 outputs a Phase Adjust signal 123 having a phase adjust step-size responsive to a previous count value Count [n], signal A or a predetermined step-size (step-size$_{up/dn}$) and signal B or a variable step-size (step-size$_{ppm}$) as seen below in Equation 14.

$$\text{Phase Adjust} = \text{Count}[n+1] = \text{Count}[n] + \text{step-size}_{up/dn} + \text{step-size}_{ppm} \qquad \text{Equ. 14}$$

In an embodiment of the present invention, circuit 700 includes an 8-bit counter 703 and is included in a CDR circuit 100 having a 5-bit update rate, 6 stages and receives a 4 Gbps Data signal 120. Accordingly, a nominal count value from counter 703 without taking into account ppm is 1.95 ps:

$$\text{count value} = 2 \times 150 \text{ ps}/2^8 = 1.95 \text{ ps} \qquad \text{Equ. 15}$$

So for every up/dn on signal A, Step-Size combiner 702 sets the following step-size$_{up/dn}$ as seen below in Equ. 16:

$$\text{set step-size}_{up/dn} \text{ (A): up} = +3.9 \text{ ps (2 cnts)}$$

$$\text{dn} = -3.9 \text{ ps } (-2 \text{ cnts}) \qquad \text{Equ. 16}$$

PPM Indicator 701 outputs a B signal, including a step-size$_{ppm}$, depending upon a detected data phase drift of Data signal 120. Table I below illustrates using a range of data phase drift or frequency differences to select a corresponding step-size$_{ppm}$ that is output from PPM indicator 701. For example, if PPM indicator 701 detects a phase drift difference of greater than 2600 ppm, a step-size$_{ppm}$ of 3.9 ps is output as signal B. Step-Size combiner 702 then sums or subtracts the values of signal A and B depending on Data signal 120's ppm with respect to Dclk 125a and whether CDR circuit 100 needs to "catch-up." For example, if PPM indicator 701 detects a high ppm of Data signal 120, combiner 702 sums a 3.9 ps step-size$_{ppm}$ and the 3.9 step-size$_{up/dn}$ to have a phase adjust step size to of 7.8 ps (4 cnts) to "catch-up" to the data and combiner subtracts the 3.9 ps step-size$_{ppm}$ and the 3.9 step-size$_{up/dn}$ to have a phase adjust step-size of 0 ps (0 cnts) if CDR circuit 100 wants to move sample clock signal Dclk clock signal 125a against a drift of the data. The summed or differenced step-size, as seen in the third and fourth columns of Table I, is then output from combiner 702 to counter 703 that adds a previously stored count value Count[n] to the summed or subtracted step-size to output Phase Adjust signal 123.

TABLE I

| Frequency difference | step-size$_{ppm}$ (B) | step-size B + A | step-size B − A |
|---|---|---|---|
| >\|2600 ppm\| | 3.9 ps (2 cnts) | 7.8 ps | 0 ps |
| >\|1300 ppm\| | 1.95 ps (1 cnts) | 5.85 ps | −1.95 ps |
| 0 ppm | 0 ps (0 cnt) | 3.9 ps | −3.9 ps |

For example, if Data signal 120 includes a data phase drift of 5000 ppm (5 bits×0.005 (ppm)×250 ps=6.25 ps every 5 bits), PPM indicator 701 outputs a 3.9 ps step-size$_{ppm}$ and Phase Adjust signal 123 includes the following step-sizes as well as maximum dither up/down values:

phase adjust up step-size=7.8 ps phase adjust dn step-size=0 ps $$\text{max dither up} = 6 \times (\text{up step-size} - \text{data drift}) \qquad \text{Equ. 17}$$
$$= 6 \times (7.8 \text{ ps} - 6.25 \text{ ps})$$
$$= 9.3 \text{ ps}$$

$$\text{max dither } dn = 6 \times (\text{down step-size} + \text{data drift}) \qquad \text{Equ. 18}$$
$$= 6 \times (0 + 6.25 \text{ ps})$$
$$= 37.5 \text{ ps}$$

In a maximum dither Dn case, combiner 702 and counter 703 is not used (0 step-size) and data is allowed to drift past a lock point or value.

Figure 8:
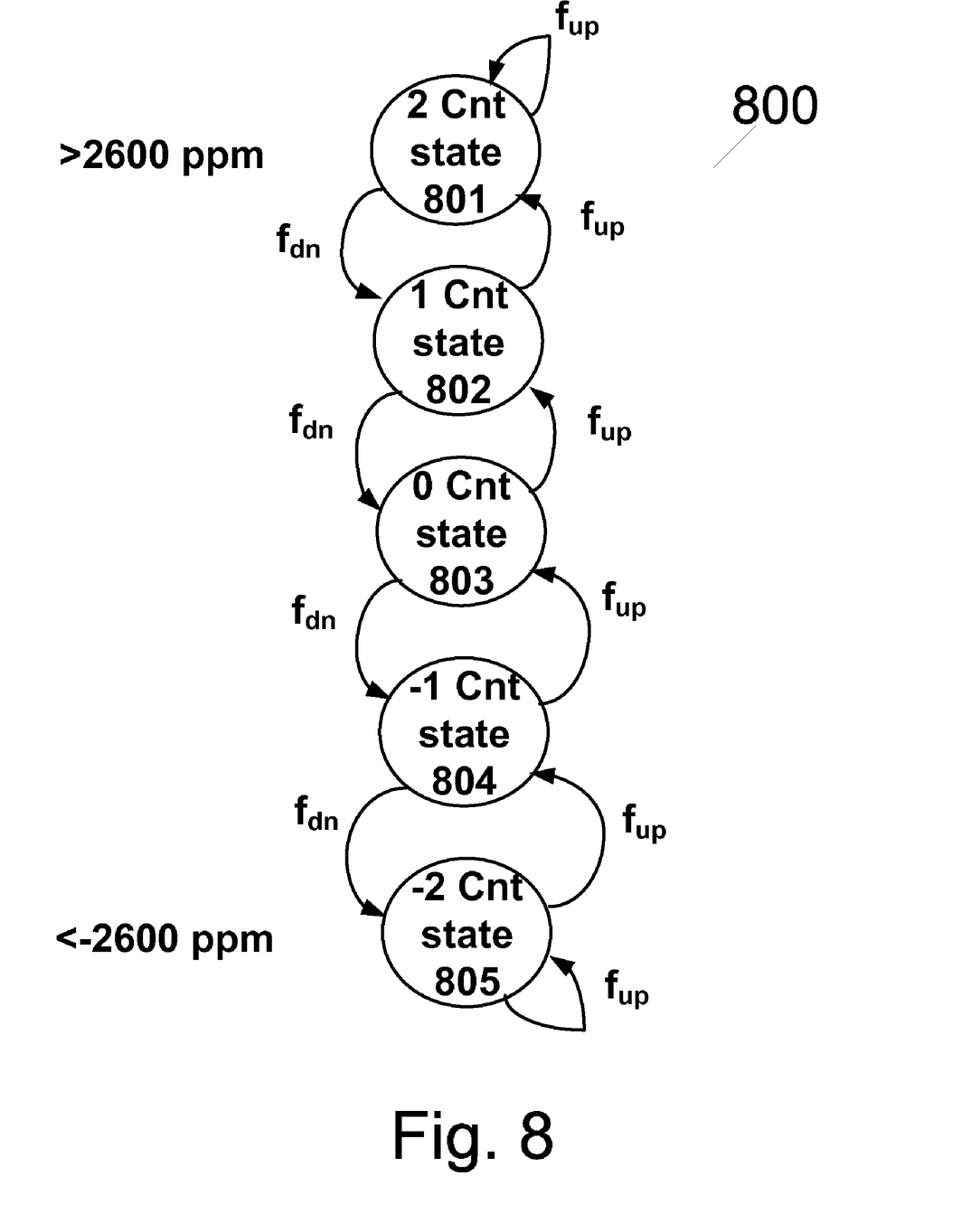
FIG. 8 is a state machine diagram for an indicator according to an embodiment of the present invention.

FIG. 8 illustrates a state machine 800 used in PPM indicator 701 to adjust the appropriate step-size$_{ppm}$ in an embodiment of the present invention. State machine 800 includes 5 states 801-805 to increment or decrement a step-size$_{ppm}$. $f_{up}$ represents a state transition toward addition of a step-size$_{ppm}$; while $f_{dn}$ represents a state transition toward subtraction of step-size$_{ppm}$. These state transitions require a frequency detector, such as PPM detector 701a, included in PPM indicator 701 to generate these step-size transitions in an embodiment of the present invention.

PPM indicator 701, and in particular a PPM detector 701a, triggers changes in states based on whether Data signal 120 includes a high or low amount data drift. In an embodiment of the present invention, the number of up and down signals from a phase detector 112 is used by PPM detector 701a to determine data drift. If the difference between up and down signals is relatively large, this indicates a high data drift in Data signal 120 because more steps in one direction is needed to "catch-up" to the drifting data.

For example, if PPM indicator 701 is in state 803 or a 0 cnt state, a phase adjust step-size is set to +3.9 ps and −3.9 ps for up and down signals, respectively.

In this example with 6 pipeline or latency stages, the number of up and down signals is then 42 and 8, respectively, as seen in Equs. 19 and 20:

$$\# \text{ of ups} = 6 + 6 \times \left( \frac{(\text{down step-size} + \text{data drift})}{(\text{up step-size} - \text{data drift})} \right) \qquad \text{Equ. 19}$$
$$= 6 + 6 \times ((3.9 + 6.25)/(|3.9 - 6.25|))$$
$$= 6 + 26$$
$$= 42$$

$$\# \text{ of } dns = 6 + 6 \times \left( \frac{(\text{up step-size} - \text{data drift})}{(\text{up step-size} + \text{data drift})} \right) \qquad \text{Equ. 20}$$
$$= 6 + 6 \times ((|3.9 - 6.25|)/(3.9 + 6.25))$$
$$= 6 + 2$$
$$= 8$$

Figure 9:
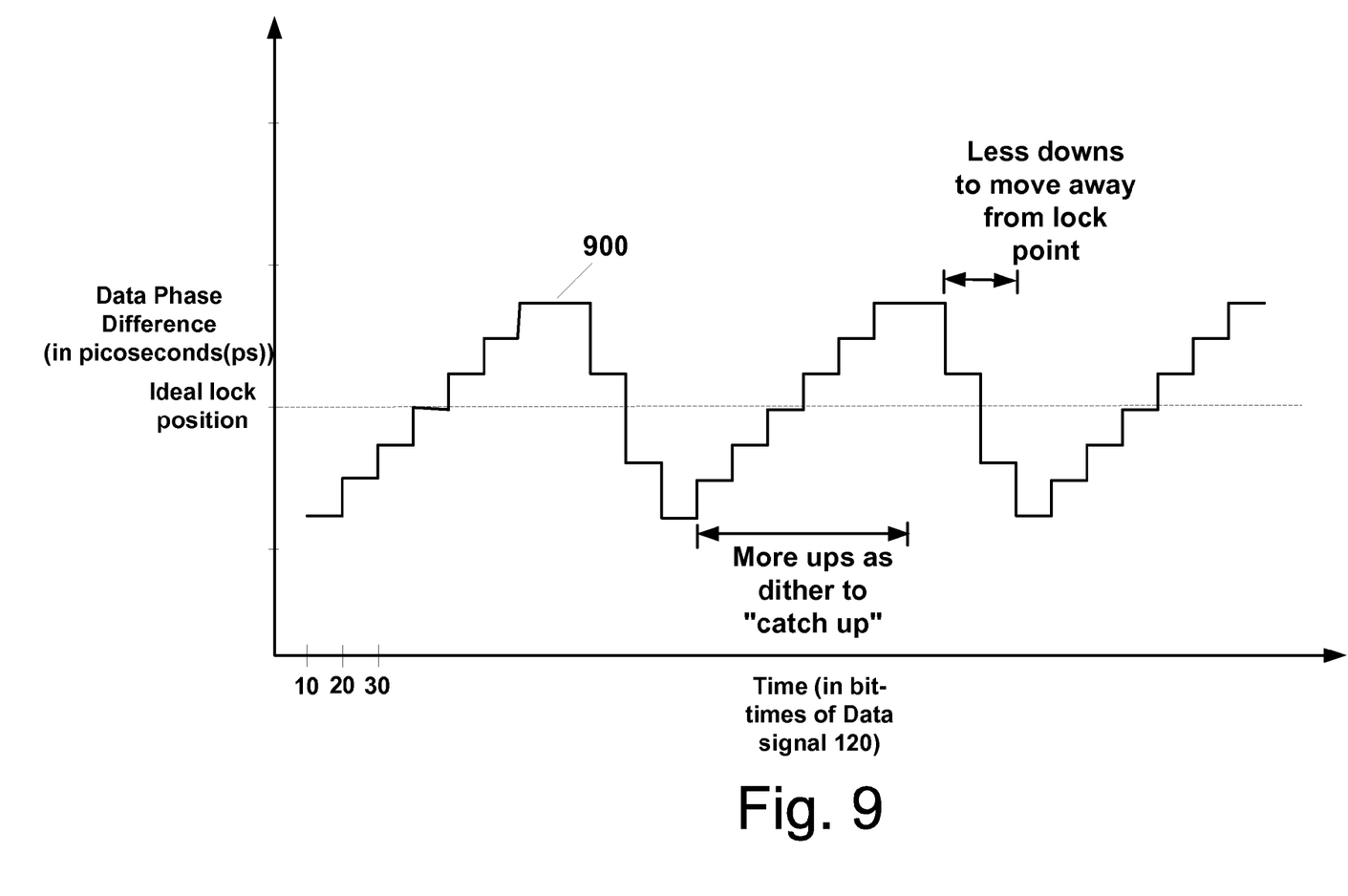
FIG. 9 illustrates when the number of up signals out number the number of down signals for a variable data bit-rate signal having a high ppm according to an embodiment of the present invention.

The number of up signals will outnumber the number of down signals when a Data signal 120 has high data drift away from up, because more ups will be needed to "catch up" to the data as the sample clock dithers about a lock position. FIG. 9 illustrates curve 900 showing more up signals are used to "catch up" to a lock phase value, or point, than down signals In an embodiment of the present invention, PPM detector 701a counts the number of up signals and the number of down signals for a predetermined period of time. PPM detector 701a then subtracts the number of up signals from the number of down signals to obtain an up/dn difference value. PPM detector 701a also stores a threshold value for determining whether PPM indicator 701 will change state. The up/dn difference value is then compared to the PPM detector threshold value in order to determine whether PPM indicator 701 should transition to a new state. For the example described above, if an up/dn difference value is greater than a threshold value of 15 for 40 updates, PPM indicator 701 would transition to a new state.

In an embodiment of the present invention, Stall circuit 500 shown in FIG. 5 is combined with PPM indicator 701 and counter/adder 702 shown in FIG. 7.

Figure 10:
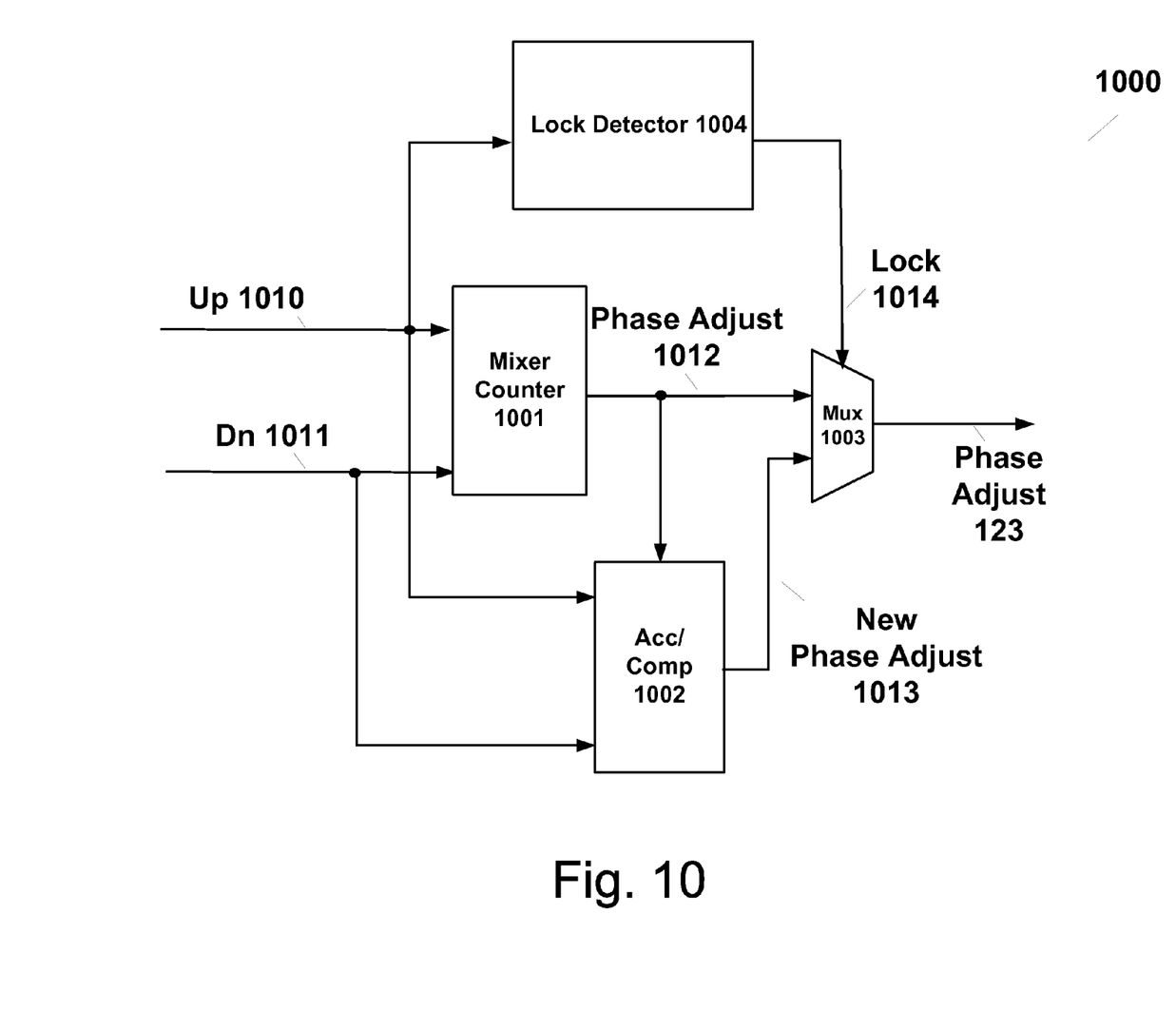
FIG. 10 illustrates an Averaging circuit according to an embodiment of the present invention.

FIG. 10 illustrates an Averaging circuit 1000 to reduce dither in a mesochronous apparatus according to an embodiment of the present invention. In an embodiment of the present invention, Averaging circuit 1000 is included in Phase Adjuster controller 114 of CDR circuit 100 shown in FIG. 1 and Data signal 120 does not have a variable data bit-rate. Averaging circuit 1000 outputs a Phase Adjust signal 123 having an adjusted phase adjust step-size by averaging and comparing Up/Dn signal 122.

An Up/Dn signal 122, shown as Up signals 1010 and Down signals 1011 in FIG. 10, are input to both mixer counter 1001 and accumulator ("Acc")/comparator ("Comp") 1002. Mixer counter 1001 outputs a Phase Adjust signal 1012 having a first step-size or count value responsive to Up signals 1010 and Down signals 1011. Phase Adjust signal 1012 is input to multiplexer 1003 and Acc/Comp 1002.

Acc/Comp 1002 averages the number of Up signals to obtain an average up value for a predetermined period of time. Likewise, Acc/Comp 1002 also averages the number of Dn signals to obtain an average down value for a predetermined period of time. In an embodiment of the present invention, the predetermined period of time is 64 update cycles. Acc/Comp 1002 then compares the average up value to the average down value. If the average up value is greater than the average down value, Acc/Comp 1002 increases a stored Phase Adjust signal 1012 a step-size or count value and outputs Phase Adjust signal 1013 having an increased step-size to multiplexer 1003. If the average up value is not greater than the average down value, Acc/Comp 1002 decrements a saved Phase Adjust signal 1012 by a step-size or count value and outputs Phase Adjust signal 1013 to multiplexer 1003. Phase Adjust signal 123, as seen in FIG. 1, is output from multiplexer 1003 responsive to a Lock signal 1014. Lock signal 1014 is generated from a CDR lock detector 1004 that indicates Dclk clock signal 125*a* has locked to the Data signal 120. Lock signal 1014 is used to speed up the phase adjustment process by bypassing the Acc/Comp 1002. If CDR circuit 100 is tracking or locked to Data signal 120, a Lock signal 1014 is asserted and Phase Adjust signal 1013 selected as an output of multiplexer 1003; otherwise, Phase Adjust signal 1012 is selected as an output of multiplexer 1003.

Figure 11:
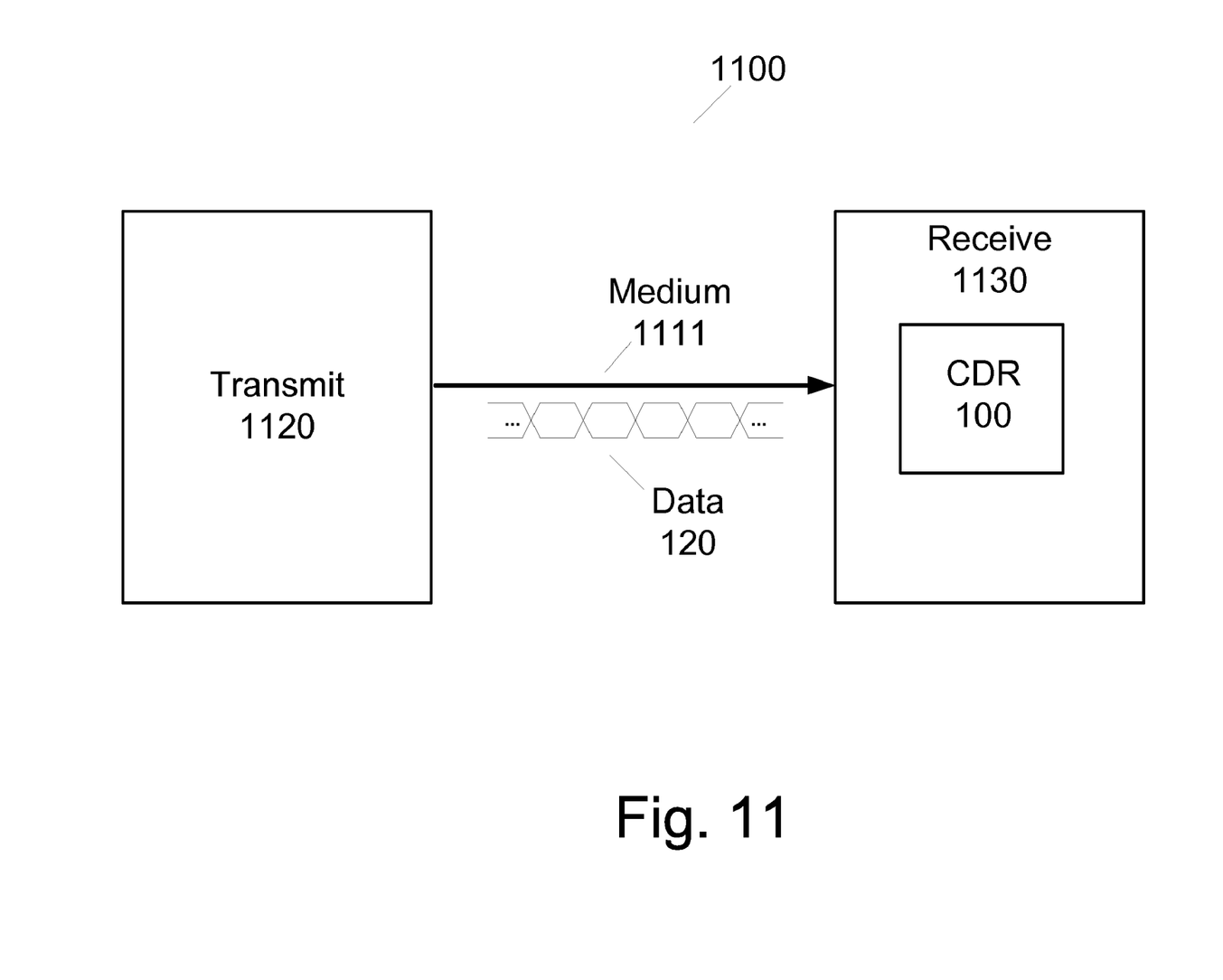
FIG. 11 illustrates an apparatus according to an embodiment of the present invention.

FIG. 11 illustrates a Communication apparatus 1100, such as a serial data system, according to an embodiment of the present invention. In an embodiment of the present invention, Communication apparatus 1100 includes a Transmit circuit 1120 and a Receive circuit 1130 coupled by medium 1111. In an embodiment of the present invention, Transmit circuit 1120 generates Data signal 120 on medium 1111 to Receive circuit 1130. Receive circuit 1130 includes a CDR circuit 100, according to embodiments of the present invention, that actively looks for transitions in the incoming Data signal 120 and phase aligns Dclk clock signal 125*a* with respect to the incoming Data signal 120 having a variable data bit-rate to provide optimal setup/hold margin times.

In an embodiment of the present invention, medium 1111 is a wire or set of wires for transporting signals. In an embodiment of the present invention, medium 1111 is a bidirectional data bus that may carry data information, control information or both. In an alternate embodiment of the present invention, medium 1111 is a unidirectional bus.

Figure 12:
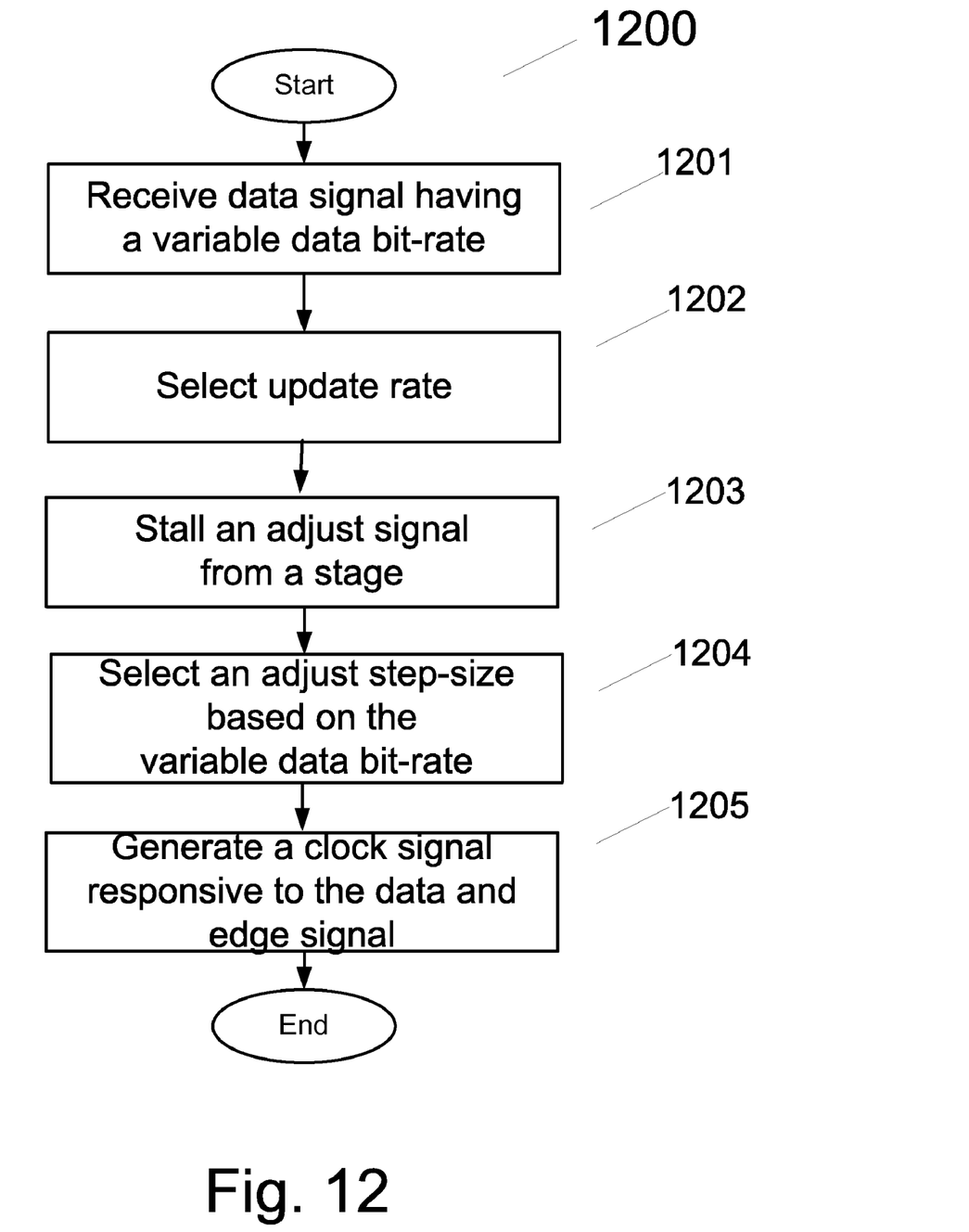
FIG. 12 illustrates a method according to an embodiment of the present invention.

FIG. 12 illustrates a method 1200 according to an embodiment of the present invention. In alternate embodiments of the present invention, steps illustrated as logic blocks shown in FIG. 12 are carried out by hardware, software or a combination thereof. In alternate embodiments, the steps illustrated in FIG. 12 are carried out by the components illustrated in FIGS. 1, 5, 7, 8, 10 and 11. As one of ordinary skill in the art would appreciate, other steps that are not shown may be included and steps shown may be removed in various embodiments of the present invention.

Method 1200 begins at logic block 1201 where a data signal having a variable data bit-rate is received. In an embodiment of the present invention, sampler 110 receives and samples a data signal. An update rate is selected as shown by logic block 1202. An adjust signal for adjusting the clock signal is provided and stalled as shown by logic block 1203. In an embodiment of the present invention, the adjust signal is used for multiple stages. A step-size for the adjust signal is then selected in response to the variable data bit-rate signal as illustrated by logic block 1204. In an embodiment of the present invention, the step-size is selected every cycle time. A clock signal is then generated to time the acquisition of data and edge values responsive to the data and edge signal and a clock source as shown in logic block 1205. Method 1200 then ends.

In various embodiments of the present invention, signals illustrated in the Figures and described herein are transferred between the circuits or electrical components by a single or multiple conductive elements, such as a metal wire or trace.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A circuit capable of tracking a data signal, comprising:
a clock circuit to generate at least one clock signal;
a sampler circuit to sample the data signal in response to the
   at least one clock signal to produce a series of data
   samples and a series of edge samples, the data signal
   having a variable data bit rate;
a phase detector to generate a phase movement signal in
   each of a plurality of adjustment cycles based on M data
   samples and N edge samples, wherein M and N are
   positive integers each larger than one; and
logic circuitry to determine a phase drift of the data signal
   with respect to the at least one clock signal based on a
   plurality of phase movement signals output by the phase
   detector over a period of time that includes multiple
   adjustment cycles;
wherein the clock circuit is configured to adjust the at least
   one clock signal to track the data signal in response to a
   phase adjust signal derived from the phase movement
   signal and the phase drift,
wherein the logic circuitry includes stall logic capable of
   stalling adjustment of the at least one clock signal during one or more current adjustment cycles in response to data phase information derived during one or more previous adjustment cycles.

2. The circuit of claim 1, wherein the at least one clock signal includes multiple clock signals and the sampler circuit includes multiple samplers to generate the series of data samples and the series of edge samples in response to respective ones of the multiple clock signals.

3. The circuit of claim 2, wherein the at least one clock signal includes a data clock signal, an edge clock signal and complementary clock signals that are 180 degrees out of phase from the data clock signal and the edge clock signal.

4. The circuit of claim 1, wherein the sampler circuit responds to both rising edges and falling edges of the at least one clock signal.

5. The circuit of claim 1, further comprising a deserializer coupled between the sampler circuit and the phase detector, the deserializer consecutive data samples and N consecutive edge samples in parallel.

6. The circuit of claim 5, wherein the M data samples include N consecutive data samples output by the deserializer in a current adjustment cycle plus one prior data sample output by the deserializer in a prior adjustment cycle, and wherein the N edge samples include N consecutive edge samples output by the deserializer in the current adjustment cycle.

7. The circuit of claim 1, wherein the phase detector includes a majority detector that votes on transitions in the M data samples using the N edge samples, to provide an Up, Dn, or no transition signal as the phase movement signal.

8. The circuit of claim 1, further comprising a divide-by-N circuit to generate a div clock signal, the div clock signal timing the phase detector and the logic circuitry.

9. A circuit capable of tracking a data signal, comprising:
a clock circuit to generate at least one clock signal;
a sampler circuit to sample the data signal in response to the at least one clock signal to produce a series of data samples and a series of edge samples, the data signal having a variable data bit rate;
a phase detector to generate a phase movement signal in each of a plurality of adjustment cycles based on M data samples and N edge samples, wherein M and N are positive integers each larger than one; and
logic circuitry to determine a phase drift of the data signal with respect to the at least one clock signal based on a plurality of phase movement signals output by the phase detector over a period of time that includes multiple adjustment cycles;
wherein the clock circuit is configured to adjust the at least one clock signal to track the data signal in response to a phase adjust signal derived from the phase movement signal and the phase drift,
wherein the logic circuitry includes an indicator that determines the phase drift of the data signal based on the plurality of phase movement signals, the indicator outputting a variable step-size signal associated with the phase drift.

10. The circuit of claim 9, wherein the indicator includes a detector that determines the phase drift by integrating the plurality of phase movement signals over a predetermined period of time.

11. The circuit of claim 10, wherein the phase movement signals are each selected from the group of up, down or no transition signals, wherein the detector subtracts a number of up signals from a number of down signals in the plurality of phase movement signals to obtain an up/dn difference value.

12. The circuit of claim 11, wherein the indicator further includes a state machine and the detector triggers changes in states in the state machine based on the phase drift in the data signal.

13. The circuit of claim 12, wherein the indicator further includes a storage that stores a threshold value, and wherein the indicator is configured to compare the up/dn difference value with the threshold value to determine whether the state machine should transition from a current state to a new state to change the variable step-size signal.

14. The circuit of claim 9, wherein the logic circuitry further includes a combiner and a counter that generate the phase adjust signal based on the phase movement signal and the variable step-size signal.

15. The circuit of claim 1, wherein the multiple adjustment cycles are included in the plurality of adjustment cycles.

16. A method performed by a circuit to track a data signal, comprising:
generate at least one clock signal;
receiving the data signal using receiver circuits clocked by the at least one clock signal to produce a series of data samples and a series of edge samples, the data signal having a variable data bit rate;
producing a phase movement signal in each of a plurality of adjustment cycles based on M data samples and N edge samples, wherein M and N are positive integers each larger than one;
integrating a plurality of phase movement signals produced over a period of time to determine a phase drift of the data signal with respect to the at least one clock signal, the period of time including multiple adjustment cycles;
adjusting the at least one clock signal to track the data signal using a clock adjustment circuit in response to a phase adjust signal derived from the phase movement signal and the phase drift; and
stalling adjustment of the at least one clock signal during one or more current adjustment cycles in response to data phase information derived during one or more previous adjustment cycles.

17. The method of claim 16, further comprising deserializing the series of data samples and the series of edge samples to output N consecutive data samples and N consecutive edge samples in parallel.

18. The method of claim 17, wherein the M data samples include N consecutive data samples output by the deserializer in a current adjustment cycle plus one prior data sample output by the deserializer in a prior adjustment cycle, and wherein the N edge samples include N consecutive edge samples output by the deserializer in the current adjustment cycle.

19. The method of claim 16, further comprising outputting a variable step-size signal associated with the phase drift.

20. The method of claim of claim 19, further comprising combining the phase movement signal and the variable step-size signal to generate the phase adjust signal.

21. The method of claim 16, wherein the M data samples are included in the series of data samples and the N edge samples are included in the series of edge samples.

22. The circuit of claim 9, wherein the indicator is a parts per million ("PPM") indicator.

* * * * *